United States Patent [19]

Garuts

[11] Patent Number: 4,835,488
[45] Date of Patent: May 30, 1989

[54] WIDEBAND LINEARIZED EMITTER FEEDBACK AMPLIFIER

[75] Inventor: Valdis E. Garuts, Beaverton, Oreg.

[73] Assignee: Tektronix, Inc., Beaverton, Oreg.

[21] Appl. No.: 143,440

[22] Filed: Jan. 13, 1988

[51] Int. Cl.[4] .............................................. H03F 3/45
[52] U.S. Cl. ..................................... 330/258; 330/261
[58] Field of Search ................ 330/252, 254, 258, 261, 330/260

[56] References Cited

U.S. PATENT DOCUMENTS 4,617,523 10/1986 Taylor ................................ 330/261

Primary Examiner—Gene Wan
Attorney, Agent, or Firm—John J. Horn; Robert S. Hulse

[57] ABSTRACT

The present invention constitutes a differential amplifier system (50) including a main differential amplifier (60) and a compensating differential amplifier (90) which are coupled together in a complementary manner to provide a composite output signal.

The amplifiers are of similar construction but have different circuit component values. Each of the amplifiers is of the differential type and includes emitter-coupled transistors (62) and (64) or (92) and (94), a feedback resistor (66) or (96) connected between the emitter leads (78) and (80) or (108) and (110) of these transistors and a pair of constant-current sources (68) and (70) or (98) and (100) separately connected to different ones of the emitter leads of the transistors. The circuit values of the constant-current sources and feedback resistors in the two amplifiers are different and are adjusted to allow the output of the compensating amplifier to cancel primary nonlinearities in the output of the main amplifier. The gain of the overall amplifier system is thereby maintained more nearly constant over a greater signal range and the composite output of the system is more linear over a wider range of input signals.

7 Claims, 3 Drawing Sheets

WIDEBAND LINEARIZED EMITTER FEEDBACK AMPLIFIER

TECHNICAL FIELD

The present invention relates to differential amplifiers and, more particularly, to differential amplifiers having emitter feedback resistors and including circuit components for compensating for non-linearities in the gain functions of the amplifiers.

BACKGROUND OF THE INVENTION

Differential amplifiers are commonly employed as key components in many integrated circuits. However, the usefulness of differential amplifiers in many instrumentation type applications is often limited by non-linearities in their gain characteristics. These non-linearities also limit the dynamic range of input signal voltage magnitudes over which the amplifiers can be employed.

The linear dynamic range of a differential amplifier can be extended through the use of "emitter-degeneration" as shown in FIG. 1. In accordance with this approach, the amplifier is provided with a pair of constant-current sources separately connected to the emitters of the transistors of the amplifier and further an "emitter feedback" resistor is connected between the emitters of these transistors. This type of circuitry reduces non-linearities in the gain of a differential amplifier but only to a limited extent.

To more fully resolve the problem and linearize the gain of a differential amplifier, circuit designers sometimes employ the "cascomp" circuit shown in FIG. 2. The voltage between the emitters of the cascode transistors $Q_3$ and $Q_4$ is nominally equal to the net base-to-emitter voltages of the primary differential transistors $Q_1$ and $Q_2$, which voltages vary non-linearly with the output signal and thereby cause the overall non-linearity of the amplifier. A compensating amplifier $A_{cmp}$ produces an amplified non-linear signal which is added to the output of the differential amplifier. The gain of the amplifier $A_{cmp}$ is adjusted so that its output should cancel the non-linear components of the output of the differential amplifier. Unfortunately, the cascomp circuit is effective only at relatively low frequencies well below the bandwidths of most differential amplifiers because among other things, the accuracy of the base-to-emitter voltage analog (i.e., the base-to-emitter voltages of $Q_3$ and $Q_4$) by which the actual nonlinearity is sensed decreases with increasing frequency.

It is, therefore, an object of the present invention to provide a differential amplifier having gain characteristics of improved linearity over a wider frequency range.

It is another object of the present invention to provide a differential emitter feedback amplifier system which allows accurate compensation for non-linearities in the gain of a differential amplifier.

It is a further object of the present invention to provide a differential amplifier system whose components can be readily implemented as integrated circuits.

SUMMARY OF THE INVENTION

The present invention constitutes a differential amplifier system including a main amplifier and a compensating amplifier which are coupled together in a complementary manner to provide a composite output signal. The amplifiers are of similar construction but have different circuit component values. Each of the amplifiers is of the differential type and includes two emitter-coupled transistors, a feedback resistor connected between the emitter leads to these transistors, and a pair of constant-current sources separately connected to different ones of the emitter leads to the transistors. However, the constant-current sources of the main amplifier provide substantially more current than that of the constant-current sources of the compensating amplifier, and the feedback resistor of the compensating amplifier is of substantially greater value than that of the feedback resistor of the main amplifier.

The amplifiers are constructed and arranged so that first and second input signals which define a differential input voltage are separately applied to the base leads of respective first and second transistors in each amplifier. The amplifiers are coupled together so that the collector lead of the first transistor in the main amplifier is connected to the collector lead of the second transistor in the compensating amplifier and collector lead of the second transistor in the main amplifier is connected to the collector lead of the first transistor in the compensating amplifier.

The main and compensating amplifiers when coupled together as described form an amplifier system which provides a composite output signal reflecting the gain characteristics of both amplifiers. The compensating amplifier effectively cancels many of the non-linearities in the gain provided by the main amplifier. Therefore, the overall gain of the amplifier system exhibits increased linearity and less distortion over a wider range of input signal voltages.

DESCRIPTION OF THE PREFERRED EMBODIMENT

Figure 1:
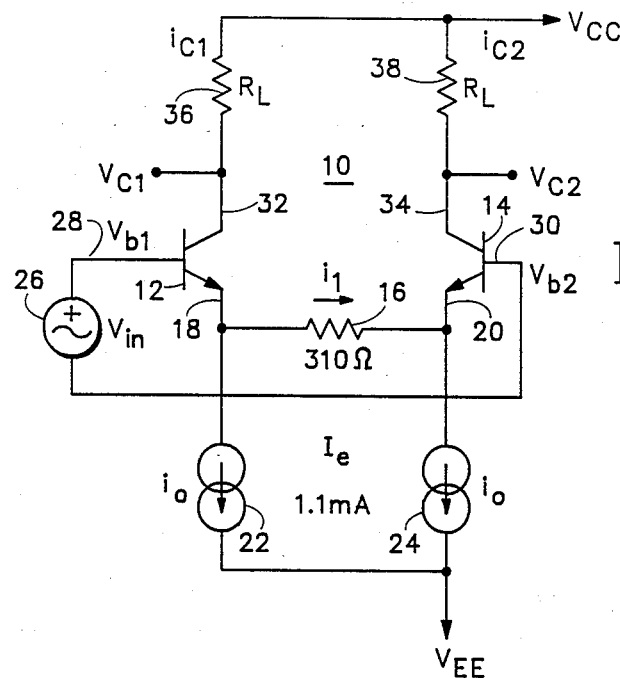
FIG. 1 is a circuit diagram of a basic prior art emitter feedback differential amplifier of the type used in the present invention.
Figure 2:
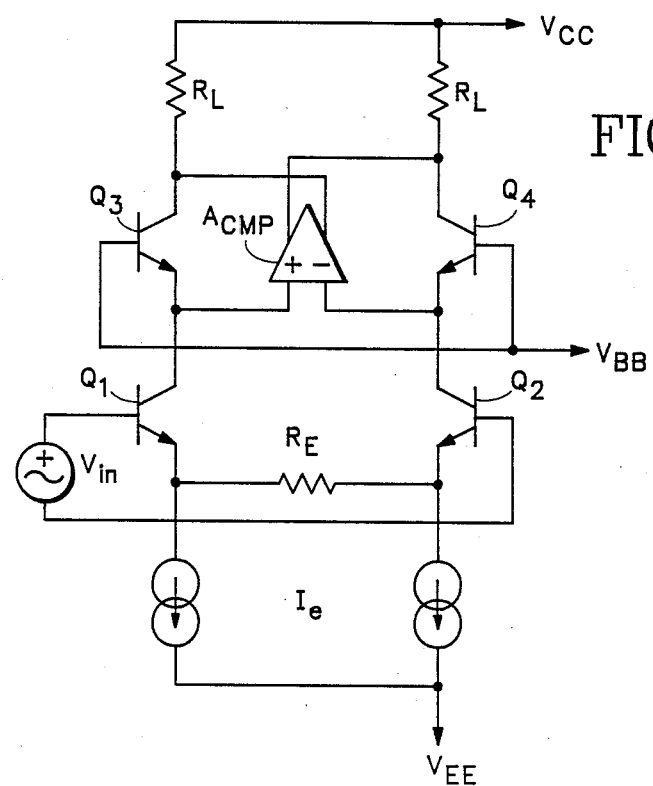
FIG. 2 is a circuit diagram of a prior art cascomp emitter feedback differential amplifier which employs certain circuitry adapted for compensating for gain non-linearities.

Referring now to FIG. 1, a conventional balanced differential amplifier 10 with emitter feedback provided through resistor 16 is shown. The amplifier 10 includes two emitter-coupled bipolar transistors 12 and 14 of the NPN type which are as identical as possible in construction, an emitter feedback resistor 16 connected between the emitter leads 18 and 20 of the respective transistors 12 and 14, and two constant-current sources 22 and 24 which are of equal current value and are separately connected to the respective emitters 18 and 20. A differential input voltage is provided by an input signal source 26 which separately supplies two input voltage signals $V_{b1}$ and $V_{b2}$ which define a differential input voltage to the respective base leads 28 and 30 of the transistors 12 and 14. The amplifier 10 generates two output current signals $i_{c1}$ and $i_{c2}$ on the respective collector leads 32 and 34 of the transistors 12 and 14. The output signals $i_{c1}$ and $i_{c2}$ from the respective transistors 12 and 14 define a differential output signal which may be considered to represent a difference between either the currents $i_{c1}$ and $i_{c2}$ or voltages $V_{c1}$ and $V_{c2}$ as provided by the action of load resistors of equal value, such as the resistors 36 and 38 connected to the respective collector leads 32 and 34.

The operation of the amplifier 10 may be described in accordance with the mathematical expression as developed below:

$$i_{c2} = i_0 + i_1, \quad i_{c1} = i_0 - i_1 \tag{1}$$
(Summing currents to collectors 36 and 38)

$$V_q = KT/q \tag{2}$$
(Defining the junction thermal voltage)
where:
$K$ = Boltzmann's constant
$T$ = temperature in degrees Kelvin
$q$ = electron charge $$i_c = I_s(e^{V_{be}/V_q} - 1) \text{ or } V_{be} = V_q \ln i_c/I_s \text{ (approximate)} \tag{3}$$
(general transistor law)
where:
$I_s$ = base/emitter junction saturation current
$i_c$ = collector current
$V_{be}$ = base/emitter voltage $$V_{b12} = V_{b1} + R_e i_1 - V_{b2} \tag{4}$$
(Summing voltages between the emitters 18 and 20)

$$V_{in} = V_{b12} = R_e i_0 (i_1/i_0) + V_q \ln[(1 + (i_1/i_0))/(1 - (i_1/i_0))] \tag{5}$$
(Substituting equation 4 in equation 5 and simplifying)

$$W = FX + \ln[(1 + X)/(1 - X)] \tag{6}$$
where:
$W = V_{in}/V_q$
$F = R_e i_0/V_q$
$X = i_1/i_0$.

Unfortunately, no simple expression can be derived from this equation for the output X in terms of the input W. However, coefficients having closed form algebraic expressions can be derived for the differentials of equation 6. The expressions for the first three derivatives of X with respect to W can be calculated to be:

$$dx/dw = \frac{1}{(F+2)} \tag{7}$$

$$d^2X/dw^2 = 0 \tag{8}$$

$$d^3X/dw^3 = -\frac{4}{(F+2)^4} \tag{9}$$

It should be noted that due to the symmetry of the amplifier circuits involved all the even order differentials are equal to zero. In view of the above, it is possible to obtain approximate design equations for the circuit by expressing the gain of the amplifier (dx/dw) as a Maclaurin series about zero.

$$A = A_0 + A_2 W^2/2! + A_4 W^4/4! + \ldots \tag{10}$$

Equation 10 provides a useful expression for the gain of an amplifier such as the amplifier 10. It should be noted that due to the symmetry of the amplifier circuit all of the odd order terms are zero. The coefficients $A_0$, $A_2$, $A_4$, etc. correspond to the coefficients of the next higher order differentials $dx/dw$, $d^3x/dw^3$, $d^5x/dw^5$, etc. as derived from equation 8.

Figure 3:
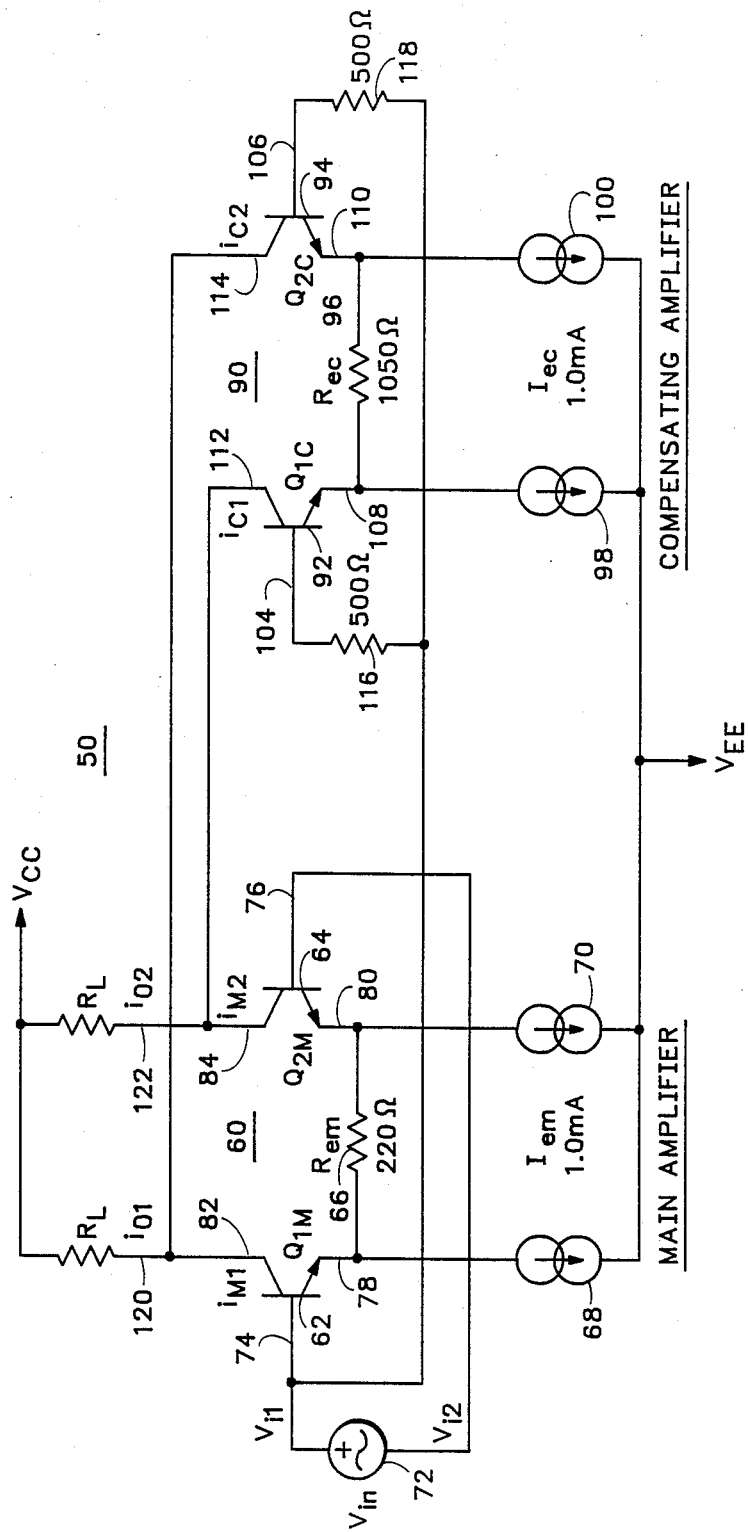
FIG. 3 is a circuit diagram of a wideband linearized emitter feedback differential amplifier system of the present invention.

Referring now to FIG. 3, the amplifier system 50 of the present invention is shown. The system 50 includes a main amplifier 60 and a compensating amplifier 90.

The main amplifier 60 is of similar construction to that of the amplifier 10. The main amplifier 60 includes two emitter-coupled bipolar transistors 62 and 64 of the NPN type which are as identical as possible in construction, am emitter feedback resistor 66, and two constant-current sources 68 and 70 of equal supply value. An input signal source 72 provides to the amplifier 60 a differential input voltage $V_{in}$ defined by two input voltage signals $V_{i1}$ and $V_{i2}$. The signals $V_{i1}$ and $V_{i2}$ are applied to the respective base leads 74 and 76 of the transistors 62 and 64. The resistor 66 has a resistance value of 220 ohms. The constant-current sources 68 and 70 are separately connected to the respective emitter leads 78 and 80 of the transistors 62 and 64. The constant-current sources 68 and 70 each provide a 1.0 mA current $I_{em}$. A differential output signal is defined by two output current signals $i_{m1}$ and $i_{m2}$, which are provided on the collector leads 82 and 84 of the respective transistors 62 and 64.

The compensating amplifier 90 is also of similar construction to that of the amplifier 10. The compensating amplifier 90 includes two emitter-coupled bipolar transistors 92 and 94 of the NPN type which are as identical as possible in construction, an emitter feedback resistor 96, and two constant-current sources 98 and 100 of equal current supply value. The input signals $V_{i1}$ and $V_{i2}$ from the input source 72 are applied to the respective base leads 104 and 106 of the transistors 92 and 94. The resistors 96 is connected between the emitter leads 108 and 110 of the respective transistors 92 and 94. The resistor 96 has a resistance value of 1050 ohms. The constant-current sources 98 and 100 are separately connected to the respective emitter leads 108 and 110 of the transistors 92 and 94. The constant-current sources 98 and 100 each provide a 0.1 mA current $I_{ec}$. A differential output signal is defined by two output current signals $i_{c1}$ and $i_{c2}$, which are provided on the respective collector leads 112 and 114 of the transistors 92 and 94.

The compensating amplifier 90 also includes two input resistors 116 and 118. The resistor 116 is connected between the signal source 72 and the base leads 104 of the transistor 92. The resistor 118 is connected between the signal source 72 and the base lead 106 of the transistor 94. The resistors 116 and 118 both have resistance values of 500 ohms and are furnished to increase the base resistance values of the transistors 92 and 94. The resistors 116 and 118 help correct for differences in the products of the base resistances and emitter-to-emitter capacitances of the two amplifiers 60 and 90, which differences can adversely affect the linearity of the system 50 at higher frequencies.

The collector lead 82 of the first transistor of the main amplifier 60 and the collector lead 114 of the second transistor 94 of the compensating amplifier 90 are both connected to the output conductor 120. The collector lead 84 from the second transistor 64 of the main amplifier and the collector lead 112 from the first transistor 92 of the compensating amplifier 90 are both connected to the output conductor 122. The output current signals $i_{m1}$ and $i_{c2}$ are combined at the conductor 120. The output current signals $i_{m2}$ and $i_{c1}$ are combined at the conductor 122. The final composite differential output signals $i_{01}$ and $i_{02}$ on conductors 120 and 122 equal $i_{m1} + i_{c2}$ and $i_{m2} + i_{c1}$, respectively.

Since the value of the gain setting resistor $R_{em}$ is substantially less than the value of the resistor $R_{ec}$, the gain (or transconductance) of the main amplifier 60 is much greater than the gain (or transconductance) of the compensating amplifier 90, and the signals $i_{m1}$ and $i_{m2}$ strongly predominate in the final composite output from the system 50. However, since the value of the compensating feedback factor $F_c$ is suitably less than the main feedback factor $F_m$, the gain of the compensating amplifier 90 therefore decreases from its zero signal value much more rapidly than does the gain of the main amplifier 60. The values of the feedback resistors and current sources are selected so that the gains (or transconductances) of the main amplifier 60 and compensating amplifier 90 decrease approximately equal for the same input signal changes.

However, the final output signals $i_{01}$ and $i_{02}$ are combinations of signals from different transistors (transistors 62 and 94 and transistors 64 and 92) in different amplifiers (60 and 90) which receive different input signals ($V_{i1}$ or $V_{i2}$) of opposite polarity. The zero signal gain of the composite system 50 is less than the gain of the main amplifier 60 due to subtraction of the gain of the compensating amplifier. However, more importantly, the changes in gain (or transconductance) contributed by the two amplifiers approximately cancel, thereby resulting in greatly improved linearity over a wider dynamic input signal range.

The performance of the composite system 50 can be analyzed through the use of Maclaurin series for the gains of the main amplifier 60 and compensating amplifier 90. In accordance with equations 11 and 12 below, the gains of the main amplifier 60 and compensating amplifier 90, respectively, may be represented in the form of Maclaurin series:

Main Amplifier 60

$$A_m = A_{m0} + A_{m2}W^2/2! + A_{m4}W^4/4! + \ldots \quad (11)$$

Compensating Amplifier 90

$$A_c = A_{c0} + A_{c2}W^2/2! + A_{c4}W^4/4! + \ldots \quad (12)$$

The gain of the composite amplifier system 50 may, therefore, be represented by the Taylor series:

$$A_m - A_c = (A_{m0} - A_{c0}) + (A_{m2} - A_{c2})W^2/2! + (A_{m4} - A_{c4})W^4/4! + \ldots \quad (13)$$

The zero signal gain equals $A_{m0} - A_{c0}$, with all other terms disappearing as $W=0$.

The fourth and higher order terms in equation 13 are much smaller than the second order terms. Therefore, maximum linearity with respect to gain may be approached when the coefficient of the second order term is set equal to zero and $A_{m2}$ equals $A_{c2}$. The coefficients $A_{m2}$ and $A_{c2}$ correspond to the coefficient of the third order differential given by equation 9. After considerable algebraic manipulation it can be shown that $A_{m2}$ will equal $A_{c2}$ when:

$$I_{ec}/I_{em} = [(F_c+2)/(F_m+2)] \quad (14)$$

where:

$F_c = R_c I_{ec}/V_q$ (Compensating feedback factor)
$F_m = R_m I_{em}/V_q$ (Main feedback factor).

The second order terms from the equations 13 and 14 cancel and the rate of change in the gain or transconductance of the systems 50 with changes in input voltage from zero is thereby minimized. However, the higher order terms only partly cancel so that the gain increases from its zero signal value predominately as the fourth power of the differential input voltage. The fourth power of the input voltage initially increases much more slowly than does the second power, and the remaining non-linearities are consequently less than the non-linearities characteristic of an uncompensated amplifier and remain reduced over a much larger portion of the total signal range.

Nevertheless, non-linearities attributable to the fourther order term in equation (13) become significant toward the limits of the linear input signal range and toward these points the compensating amplifier 90 overcompensates for changes in the gain of the main amplifier 60. Therefore, the performance of the composite system 50 may be yet further improved by marginally increasing the feedback factor $F_c$ of the compensating amplifier by slightly increasing the currents of the constant-current sources 98 and 100 or the value of the resistor 96 from the respective currents or values computed in accordance with equation 14. A more linear overall response with less distortion may thereby be provided over the entire signal range.

Figure 4:
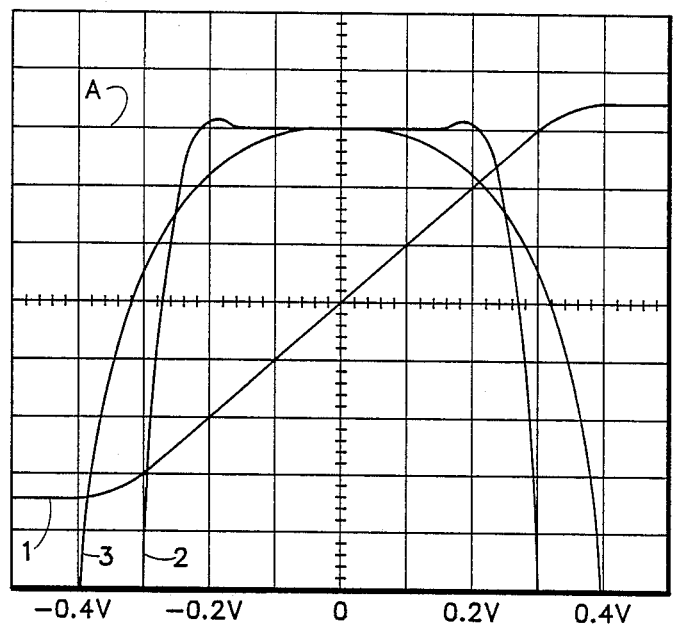
FIG. 4 is a graph providing an illustration of the performance of the amplifier system of the present invention in comparison with an uncompensated amplifier.
Figure 3:
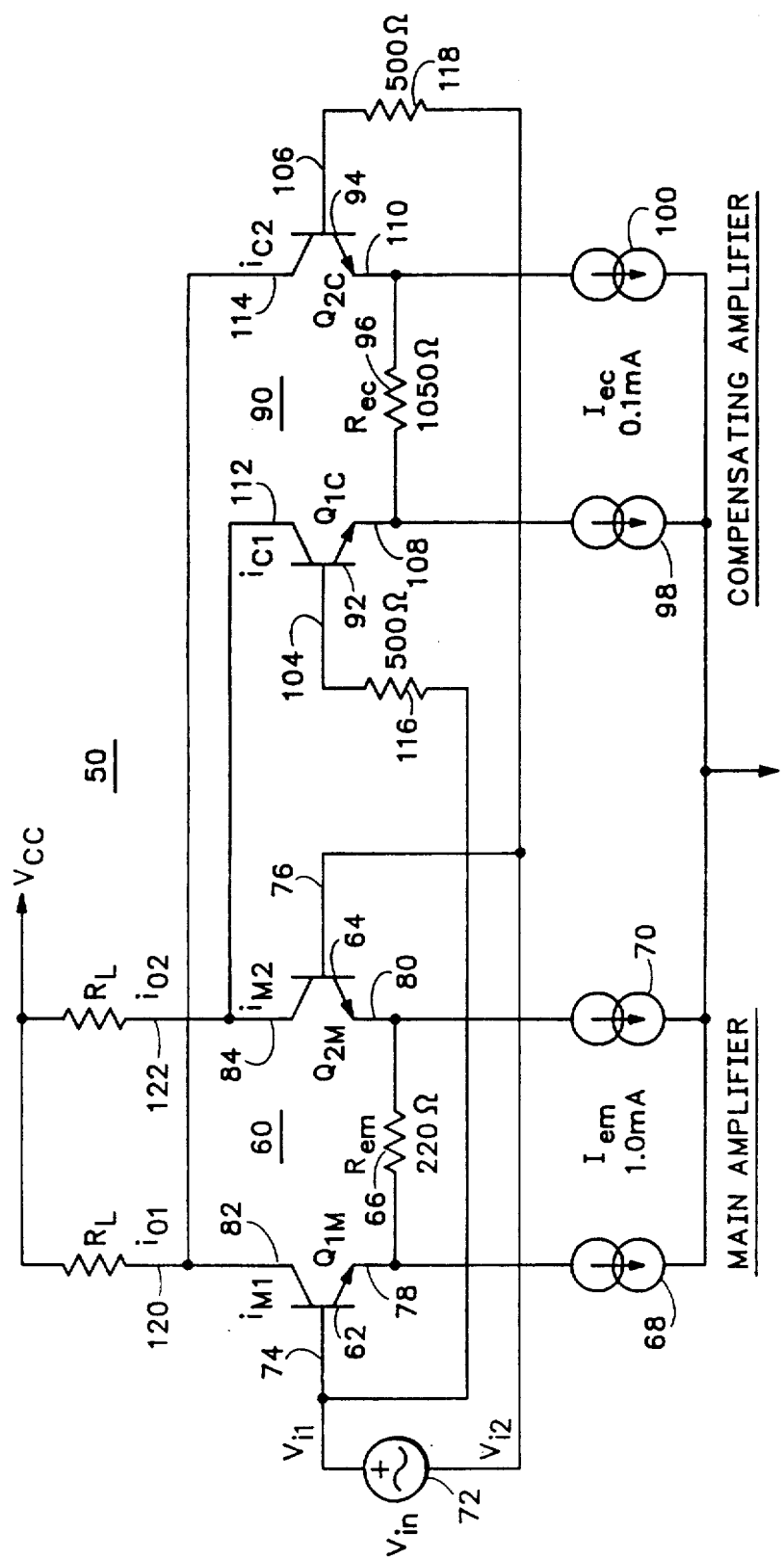

Referring now to FIG. 4, illustrative performance results are graphically shown for an amplifier system in accordance with the present invention with the component values of the system 50 of FIG. 3. The results shown in FIG. 4 were obtained by means of SPICE computer program simulations. The curve 1 corresponds to a transfer curve for the amplifier system 50 with the output current plotted versus differential input voltage. For the curve 1 each vertical division on the graph represents a 0.25 mA change in collector current. The curve 2 corresponds to the transconductance or gain of the amplifier system 50 with the transconductance plotted versus differential input voltage. With respect to curve 2 each vertical division on the graph represents a 0.1 mS change in the transconductance. For the amplifier system 50 the magnitude of the zero input signal value transconductance was 2.70 mS as represented on the graph in this case by the level of line A. The curve 3 is presented for purposes of comparison and corresponds to the transconductance or gain of an uncompensated amplifier such as the amplifier 60 with a feedback factor of 10. With respect to curve 3 each vertical division on the graph represents a 0.1 mS change in transconductance. For the uncompensated amplifier the magnitude of the zero input signal value transconductance was 3.16 mS as also represented on the graph in this case by the level of line A. As FIG. 4 demonstrates, the transconductance or gain of the amplifier system 50 remains more uniformly constant over a wider input signal range.

Table I below shows the effect of frequency on the harmonic distortion of the amplifier system 50 in comparison with an uncompensated amplifier such as amplifier 60 having the same gain and power consumption. The data was obtained by means of computer simulations.

TABLE I

| | Total Harmonic Distortion (%) | | |
|---|---|---|---|
| Frequency | Uncompensated | Compensated | Ratio |
| 100 MHz | 0.15 | 0.014 | 0.093 |
| 400 MHz | 0.15 | 0.013 | 0.087 |
| 1 GHz | 0.15 | 0.015 | 0.10 |
| 2 GHz | 0.14 | 0.039 | 0.28 |

TABLE I-continued

| | Total Harmonic Distortion (%) | | |
| --- | --- | --- | --- |
| Frequency | Uncompensated | Compensated | Ratio |
| 4 GHz | 0.12 | 0.062 | 0.52 |

At low frequencies there is approximately a tenfold improvement in harmonic distortion compared to an uncompensated amplifier. Furthermore, although the improvement degrades with increasing frequency, it still extends over a wide frequency range including higher frequencies of several Gigahertz.

As may be apparent from the preceding description, certain changes may be made in the above constructions without departing from the scope of the invention. Therefore, the embodiments described herein and shown in the drawings are intended to be illustrative in nature and are not meant to be interpreted as limiting the following claims.

I claim:

1. A differential emitter feedback amplifier system having increased linearity over wider range of input signal magnitudes, said system comprising:

a main balanced differential amplifier including a first pair of emitter-coupled transistors connected to separately receive first and second input signals defining a differential input voltage, an emitter feedback resistor connected between and coupling the emitters of the transistors, and a pair of constant-current sources connected to different ones of the emitters of the first pair of transistors;

a compensating balanced differential amplifier including a second pair of emitter-coupled transistors connected to separately receive said first and second input signals defining said differential input voltage, an emitter feedback resistor connected between and coupling the emitters of these transistors and a pair of constant-current sources connected to different ones of the emitters of the second pair of transistors; and means for coupling the collectors of said transistors in said main amplifier to the collectors of the transistors in said compensating amplifier so that the collector of the transistor in the compensating amplifier receiving the first input signal is connected to the collector of the transistor in the main amplifier receiving the second input signal and so that the collector of the transistor in the compensating amplifier receiving a second input signal is connected to the collector of the transistor in the main amplifier receiving the first input signal, thereby to form differential output signals which are composites of different output signal from said main and compensating amplifiers.

2. The system of claim 1, wherein:

said emitter feedback resistor in said compensating amplifier is selected to have a resistance value substantially greater than the resistance value of said emitter feedback resistor in said main amplifier, in order to provide approximately equal changes in gain for said compensating amplifier and said main amplifier for the same magnitude of input signal; and said constant-current sources in said compensating amplifier are selected to provide a feedback factor substantially less than the feedback factor provided by the constant-current sources in said main amplifier.

3. The system of claim 1, wherein:

the parameters for said constant-current sources and emitter feedback resistors are selected substantially in accordance with the mathematical relationship:

$$I_{ec}/I_{em} = \left[ \frac{(R_c I_{ec}/V_q) + 2}{(R_m I_{em}/V_q) + 2} \right]^4$$

where:

$V_q = KT/q$;

$R_c$, $R_m$ = values of emitter feedback resistors in compensating and main amplifiers, respectively; and $I_{ec}$, $I_{em}$ = magnitudes of currents provided by current sources for compensating and main amplifiers, respectively.

4. The system of claim 1, wherein said compensating amplifier further includes:

a pair of input resistors separately connected to the bases of said transistors in said compensating amplifier for increasing the base input resistances of these transistors with respect to input signals and thereby helping to increase linearity of the system at higher frequencies.

5. A differential amplifier system constructed and arranged to amplify a differential input signal defined by first and second input signals and provide a differential output signal defined by first and second output signals, comprising:

(A) a main differential amplifier constructed and arranged to amplify said differential input voltage, said main amplifier including:

(a) a first transistor connected to receive said first input signal, (b) a second transistor connected to receive said second input signal, (c) an emitter feedback resistor coupling the emitters of said transistors of said main amplifier, and (d) a pair of constant-current sources connected to different ones of the emitters of said transistors of said main amplifier;

(B) a compensating differential amplifier constructed and arranged to amplify said differential input voltage defined by said first and said second input signals and provide output signals adapted for cancelling non-linearities in the gain of said main amplifier, said compensating amplifier including:

(a) a first transistor connected to receive said second input signal, (b) a second transistor connected to receive said first input signal, (c) an emitter feedback resistor coupling the emitters of said transistors of said compensating amplifier, said resistor selected to provide a resistance value substantially greater than the resistance value of said emitter feedback resistor in said main amplifier, and (d) a pair of constant-current sources connected to different ones of the emitters of said transistors of said compensating amplifier, said constant-current sources selected to provide currents substantially less than the currents provided by the constant-current sources in said main amplifier; and (C) means for conducting the output signals provided by said differential amplifier system, including:
  (a) means for connecting the collector of said first transistor of said compensating amplifier to the collector of said second transistor of said main amplifier, and
  (b) means for connecting the collector of said second transistor of said compensating amplifier to the collector of said first transistor of said main amplifier.

6. The system of claim 5, wherein:
the parameters for said constant-current sources and emitter feedback resistors are selected substantially in accordance with the mathematical relationship:

$$I_{ec}/I_{em} = \left[\frac{(R_c I_{ec}/V_q) + 2}{(R_m I_{em}/V_q) + 2}\right]^4$$

where:
$V_q = KT/q$;
$R_c, R_m$ = value of emitter feedback resistors in compensating and, main amplifiers, respectively; and
$I_{ec}, I_{em}$ = magnitudes of currents provided by current sources for compensating and main amplifiers, respectively.

7. The system of claim 5, wherein said compensating differential amplifier further includes:
  (e) a pair of input resistors separately connected to the bases of said transistors in said transistors in said compensating amplifier for increasing the base input resistances of these transistors with respect to input signals and thereby helping to increase linearity of the system at higher frequencies.

* * * * *

UNITED STATES PATENT AND TRADEMARK OFFICE
CERTIFICATE OF CORRECTION

PATENT NO. : 4,835,488

DATED : May 30, 1989

INVENTOR(S) : Valdis E. Garuts

It is certified that error appears in the above-identified patent and that said Letters Patent is hereby corrected as shown below:

Corrected drawing Fig. 3 to comply with the description at page 7, line 28 through page 8, line 11.

Signed and Sealed this

Fifteenth Day of January, 1991

Attest:

HARRY F. MANBECK, JR.

*Attesting Officer*                *Commissioner of Patents and Trademarks*